United States Patent
Lambert et al.

(10) Patent No.: US 11,333,574 B2
(45) Date of Patent: May 17, 2022

(54) METHOD FOR MONITORING COOLING FAN PERFORMANCE AND SYSTEM THEREFOR

(71) Applicant: DELL PRODUCTS, LP, Round Rock, TX (US)

(72) Inventors: Timothy M. Lambert, Austin, TX (US); Michael J. Stumpf, Cedar Park, TX (US); Nihit S. Bhavsar, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 78 days.

(21) Appl. No.: 16/877,914

(22) Filed: May 19, 2020

(65) Prior Publication Data

US 2021/0364386 A1 Nov. 25, 2021

(51) Int. Cl.
| | |
|---|---|
| *G01M 13/00* | (2019.01) |
| *G01R 19/00* | (2006.01) |
| *G06Q 10/00* | (2012.01) |
| *G05B 19/416* | (2006.01) |
| *G01P 3/44* | (2006.01) |

(52) U.S. Cl.
CPC ............ *G01M 13/00* (2013.01); *G01P 3/44* (2013.01); *G01R 19/0092* (2013.01); *G05B 19/416* (2013.01); *G06Q 10/20* (2013.01); *G05B 2219/49216* (2013.01)

(58) Field of Classification Search
CPC ...... G01M 13/00; G01P 3/44; G01R 19/0092; G05B 19/416; G05B 2219/49216; G06Q 10/20
USPC ........................................................ 702/183
See application file for complete search history.

(56) References Cited

U.S. PATENT DOCUMENTS

| | | | |
|---|---|---|---|
| 5,448,143 | A | 9/1995 | Pecone |
| 5,621,159 | A | 4/1997 | Brown et al. |
| 2019/0390864 | A1* | 12/2019 | Lambert ............... H02P 27/026 |

OTHER PUBLICATIONS

"Control method of multi-fan adjusting speed according to temperature (English)", Lai wen-xian, TW I684710 B, Published on Feb. 11, 2020.*

* cited by examiner

*Primary Examiner* — John H Le
(74) *Attorney, Agent, or Firm* — Larson Newman, LLP

(57) ABSTRACT

A method may include providing a first pulse width modulation (PWM) signal to a microcontroller unit (MCU) included at a cooling fan. The method may further include receiving information from the MCU identifying a duty cycle of a second PWM signal generated by the MCU, the duty cycle of the second PWM signal determined by the MCU based on a duty cycle of the first PWM signal and based on a tachometer signal received from a rotor included at the cooling fan. The present current consumption of the cooling fan may be determined based on the duty cycle of the second PWM signal.

20 Claims, 6 Drawing Sheets

METHOD FOR MONITORING COOLING FAN PERFORMANCE AND SYSTEM THEREFOR

FIELD OF THE DISCLOSURE

This disclosure generally relates to information handling systems, and more particularly relates to cooling fan performance.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A method may include providing a first pulse width modulation (PWM) signal to a microcontroller unit (MCU) included at a cooling fan. The method may further include receiving information from the MCU identifying a duty cycle of a second PWM signal generated by the MCU, the duty cycle of the second PWM signal determined by the MCU based on a duty cycle of the first PWM signal and based on tachometer signal received from a rotor included at the cooling fan. The method may further include determining a present current consumption of the cooling fan based on the duty cycle of the second PWM signal.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
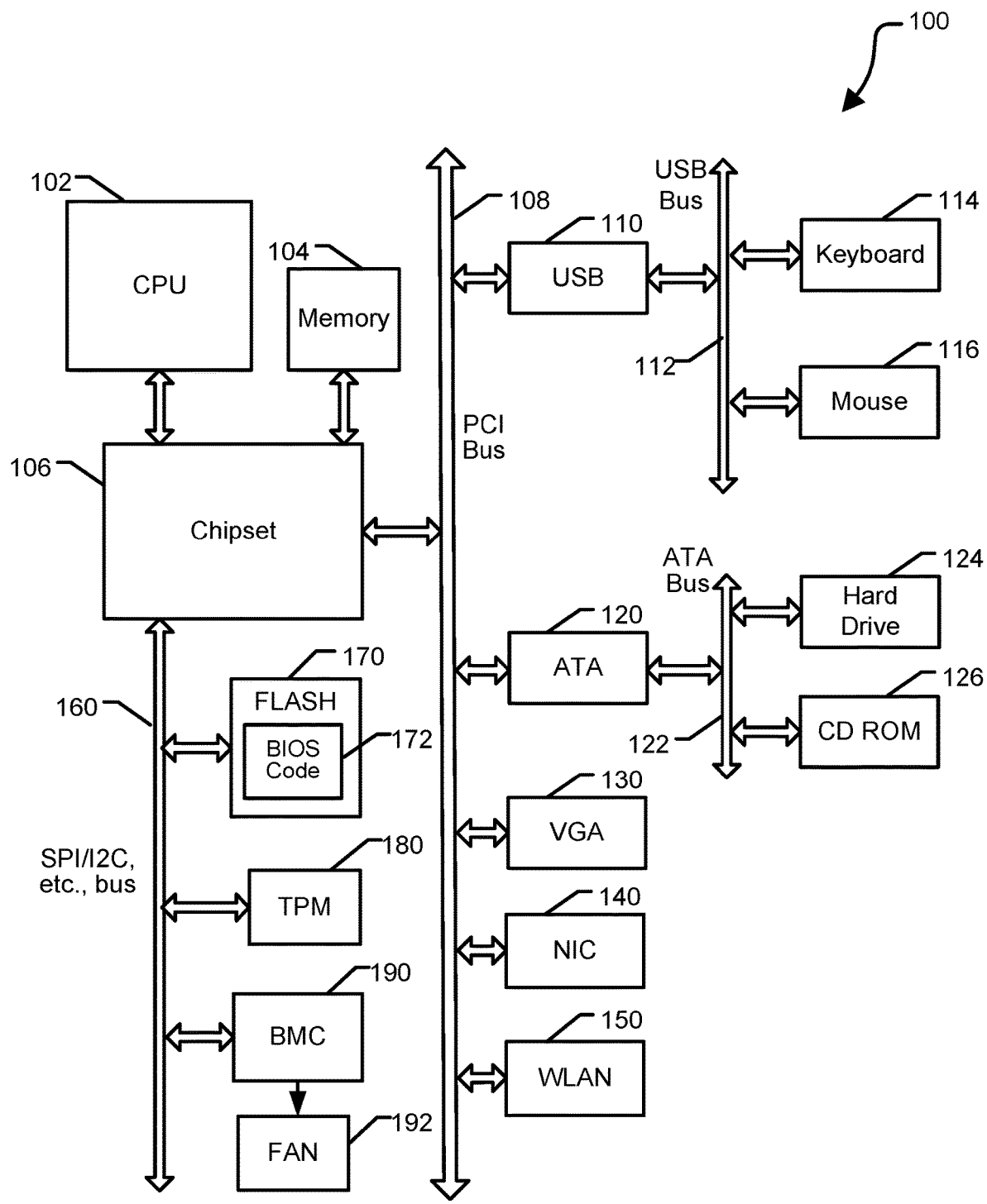
FIG. 1 is a block diagram of an information handling system according to a specific embodiment of the present disclosure.

FIG. 1 illustrates an information handling system 100 including a processor 102, a memory 104, a chipset 106, a Peripheral Component Interconnect (PCI) bus 108, a Universal Serial Bus (USB) controller 110, a USB 112, a keyboard device 114, a mouse device controller 116, an Advanced Technology Attachment (ATA) bus controller 120, an ATA bus 122, a data storage device 124, a compact disk read only memory (CD ROM) device 126, a video graphics array (VGA) device 130, a display device 131, a network interface controller (MC) 140, a wireless local area network (WLAN) controller 150, one or more serial busses 160, a non-volatile rand access memory (NVRAM) 170 for storing a basic input/output system (BIOS) 172, a Trusted Platform Module (TPM) 180, a baseboard management controller (BMC) 190, and a cooling fan 192.

NVRAM 170 can be referred to as a serial peripheral interface (SPI) flash storage device, BIOS SPI, and the like. TPM 180 is configured to ensure that the boot process starts from a trusted combination of hardware and software, and continues until the operating system has fully booted and applications are running. TPM 180 is compliant with an international standard for a secure cryptoprocessor, a dedicated microcontroller designed to secure hardware through integrated cryptographic keys. BMC 190 can be referred to as a service processor, an embedded controller (EC), and the like. BMC 190 includes a processor that can operate out-of-band with respect to CPU 102. For example, remote management systems can utilize BMC 190 to access components at information handling system independent of an operating state of CPU 102. BMC 190 may be responsible for performing low level hardware tasks including thermal management and power management operations.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and one ore more components can be integrated together. For example, portions of chipset 106 can be integrated within CPU 102. In an embodiment, chipset 106 can include a platform controller hub (PCH). System 100 can include additional buses and bus protocols. Serial bus 160 is representative of one or more busses and/or bus protocols, such as a serial peripheral interface (SPI) bus, an inter-integrated circuit protocol (I2C) bus, a system management bus (SMB), a power management bus (PMBus), and the like. Additional components of information handling system 100 can include one or more storage devices that can store machine-executable code, one or more communications ports for communicating with external devices, and various input and output (I/O) devices, such as a keyboard, a mouse, and a video display.

For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch, a router, or another network communication device, or any other suitable device and may vary in size, shape, performance, functionality, and price. Further, information handling system 100 can include processing resources for executing machine-executable code, such as CPU 102, a programmable logic array (PLA), an embedded device such as a System-on-a-Chip (SoC), or other control logic hardware. Information handling system 100 can also include one or more computer-readable medium for storing machine-executable code, such as software or data.

BIOS 172 includes instructions executable by CPU 102 to initialize and test the hardware components of system 100, and to load a boot loader or an operating system (OS) from a mass storage device. BIOS 172 additionally provides an abstraction layer for the hardware, that is a consistent way for application programs and OS to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device. In an embodiment, BIOS 172 can provide one or more runtime processes or device drivers that are configured to support functionality disclosed herein. After the initialization procedure is complete and an operating system is loaded, such as Windows, computational operation of information handling system can begin. In an embodiment, the BIOS 172 can be substantially compliant with one or more revisions of the UEFI specification.

Cooling fan 192 is representative of one or more cooling fans included at information handling system 100. Cooling fan 192 includes an electronic control system, such as a microcontroller. The electronic control system can be integrated with a cooling fan rotor or may a discrete component. Cooling fan 192 may therefore be referred to as a smart fan, a cooling fan system, a cooling fan assembly, and the like. Over an operating lifetime, the performance and operating efficiency of a cooling fan may decrease due to wear of rotor bearings, dust accumulation, damage to the fan's rotor/impeller, and the like. Furthermore, an amount of power required to operate the fan at specified performance levels may increase over time. Current consumption also may vary based on barometric pressure. The current consumption of a heavily worn cooling fan may exceed the capabilities of a driver circuit that powers the fan. In addition, cooling fans represent a portion of a total power budget of an information handling system. Accordingly, it is important to know how much current is being consumed by the cooling system, so as to not exceed the current specifications of a power supply unit that supplies power to system 100. While current sensors can be used to monitor power dissipated at a cooling fan, such devices add cost to manufactures. Techniques disclosed herein provide a means to estimate current consumed by a cooling fan without the use of a current sensor device.

Figure 2:
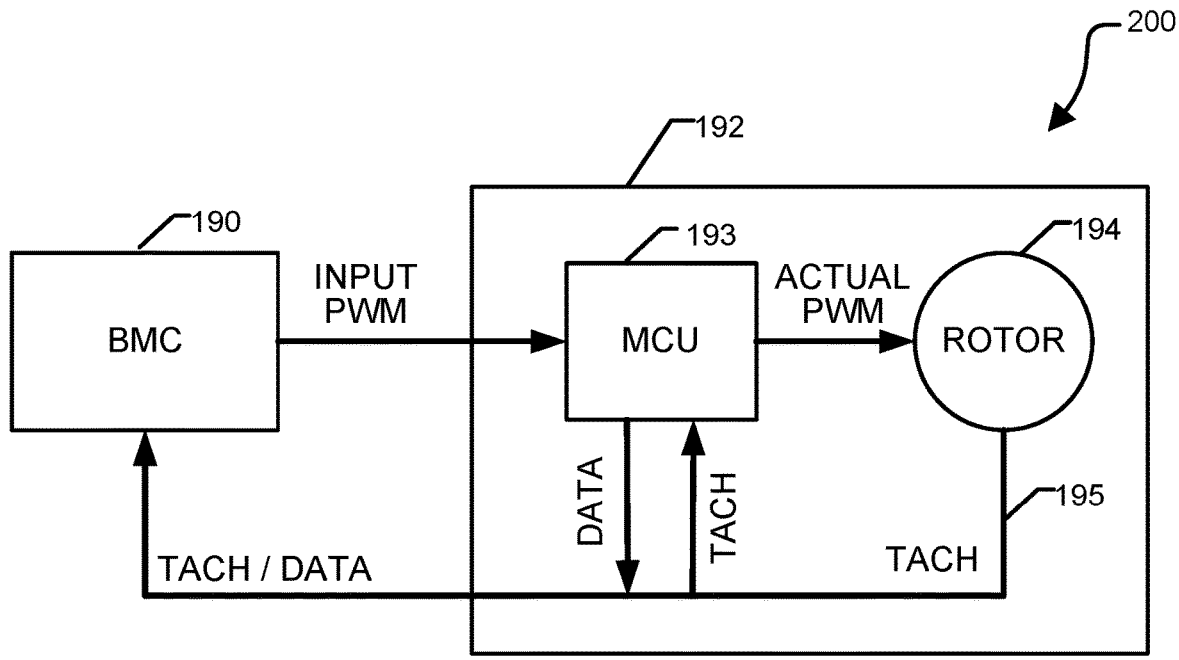
FIG. 2 is a block diagram illustrating a system for estimating current consumption at a cooling fan according to a specific embodiment of the present disclosure.

FIG. 2 shows a system 200 for estimating current consumption at a cooling fan according to a specific embodiment of the present disclosure. System 200 includes BMC 190 and cooling fan 192. Cooling fan 192 includes a microcontroller unit (MCU) 193 and a rotor 194. BMC 190 includes an output to provide a pulse width modulated (PWM) signal, INPUT PWM, to MCU 193, and an input coupled to an interconnect 195 to receive tachometer information, TACH, from rotor 194, and to receive duty cycle information, DATA, from MCU 193. MCU 193 has an input to receive signal INPUT PWM, an input to receive signal TACH via interconnect 195, an output to provide a second PWM signal, ACTUAL PWM, to rotor 194, and an output to provide signal DATA to BMC 190 via interconnect 195. Rotor 194 has an input to receive signal ACTUAL PWM from MCU 193 and an output to provide signal TACH to interconnect 195. For clarity, FIG. 2 shows an output of MCU 193 corresponding to signal DATA and a separate input for receiving signal TACH, however in practice MCU 193 can include a single input/output terminal coupled to interconnect 195 to output signal DATA and to input signal TACH.

During operation, BMC can generate signal INPUT PWM having a duty cycle selected to operate rotor at a desired speed, measured in revolutions per minute (RPM). A higher duty cycle value corresponds to a higher rotor RPM. MCU 193 is configured to generate signal ACTUAL PWM that is provided to rotor 194. A duty cycle of signal ACTUAL PWM is determined based on the duty cycle of signal INPUT PWM and the RPM of rotor 194 as communicated to MCU 193 by signal Tach via interconnect 195. When rotor 194 is new and without wear, the duty cycle of signal ACTUAL PWM can be expected to be substantially the same as the duty cycle of signal INPUT PWM. However, as rotor 194 experiences wear, the speed of rotor 194, as indicated by signal Tach, may decrease given a particular PWM duty cycle, relative to the speed achieved by rotor 194 given the same PWM duty cycle when rotor 194 was new. Accordingly, MCU 193 is configured to increase the duty cycle of signal ACTUAL PWM as necessary to achieve a desired RPM of rotor 194. For example, MCU can include a lookup table, a polynomial expression, or the like, that identifies a relationship between duty cycle of a PWM signal applied to rotor 194 and a corresponding RPM of rotor 194 when the rotor is new or without wear. If MCU determines that the RPM of rotor 194 is less than specified by the lookup table, given the duty cycle of the INPUT PWM signal, MCU can increase the duty cycle of signal ACTUAL PWM so that the desired RPM corresponding to the duty cycle of the INPUT PWM signal is achieved.

Figure 4:
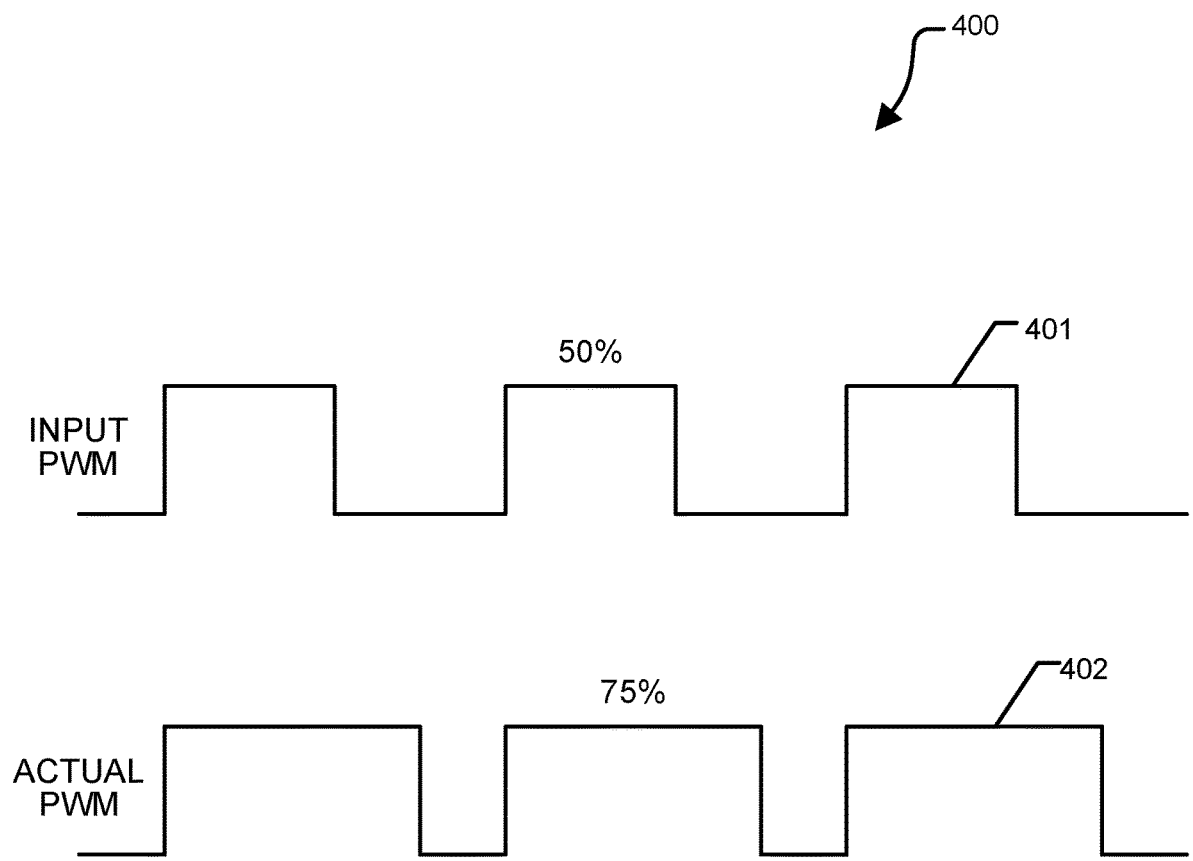
FIG. 4 is a timing diagram illustrating waveforms corresponding to the pulse width modulated signals of FIG. 2, according to a specific embodiment of the present disclosure.

FIG. 4 shows a waveform 401 corresponding to the INPUT PWM signal and a waveform 402 corresponding to the ACTUAL PWM signal. As illustrated, the INPUT PWM signal has a duty cycle of 50 percent, and the ACTUAL PWM signal has a duty cycle of 75 percent. During operation, MCU 193 can utilize the lookup table or polynomial expression to determine an RPM of rotor 194 that should be provided given an INPUT PWM duty cycle of 50 percent. If the RPM of rotor 194, as indicated by signal TACH, is less than the expected value, MCU can determine that rotor 194 is experiencing wear. Accordingly, MCU can utilized the lookup table or polynomial expression to perform a reverse-lookup to identify a duty cycle of signal ACTUAL PWM that will provide the desired rotor RPM that BMC 190 intended when it generated the 50 percent duty cycle of signal INPUT PWM.

Figure 5:
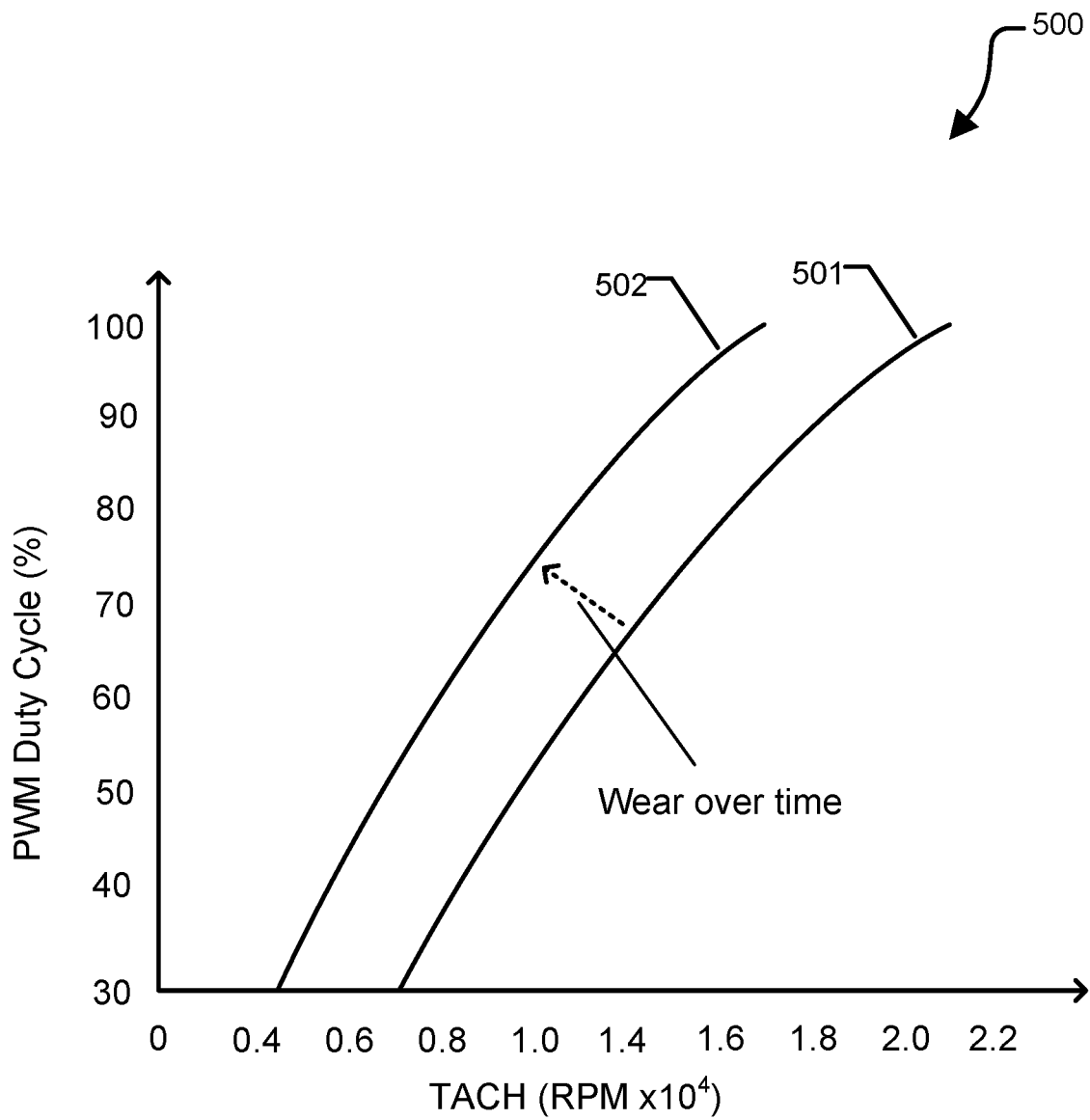
FIG. 5 is a graph illustrating how the performance of a cooling fan can degrade over time due to wear, according to a specific embodiment of the present disclosure.

FIG. 5 shows a graph 500 illustrating how the performance of fan 192 can degrade over time due to wear, according to a specific embodiment of the present disclosure. Graph 500 includes a vertical axis representing a duty cycle of an applied PWM energizing signal, and a horizontal axis representing rotor RPM, as indicated by signal TACH. Graph 500 further includes a curve 501 representing a relationship between a duty cycle of an applied PWM signal and a corresponding rotor RPM when the fan is new, and a curve 502 representing a relationship between a duty cycle of an applied PWM signal and a corresponding rotor RPM when the fan is exhibiting wear. In particular, curve 502 shows that the rotor RPM decreases for a given PWM duty cycle relative to curve 501. In an embodiment, curve 501 can provide the basis for the lookup table or polynomial described above.

Returning to FIG. 2, MCU 193 uses signal DATA to inform BMC 190 of the duty cycle of signal ACTUAL PWM. In the particular embodiment illustrated in FIG. 2, the information is over-driven or otherwise multiplexed with the TACH information received from rotor 194. For example, BMC 190 can alternatingly receive the tachometer information and the duty cycle information. BMC can estimate a present current consumption of fan 192 based on the duty cycle of signal ACTUAL PWM and based on a second lookup table or polynomial that expresses a relationship between a duty cycle of an applied PWM energizing signal and an amount of current dissipated by fan 192, the relationship representing the specification of fan 192 when new, prior to wear. The technique for estimating the present current consumption can be better understood with reference to FIG. 6.

Figure 6:
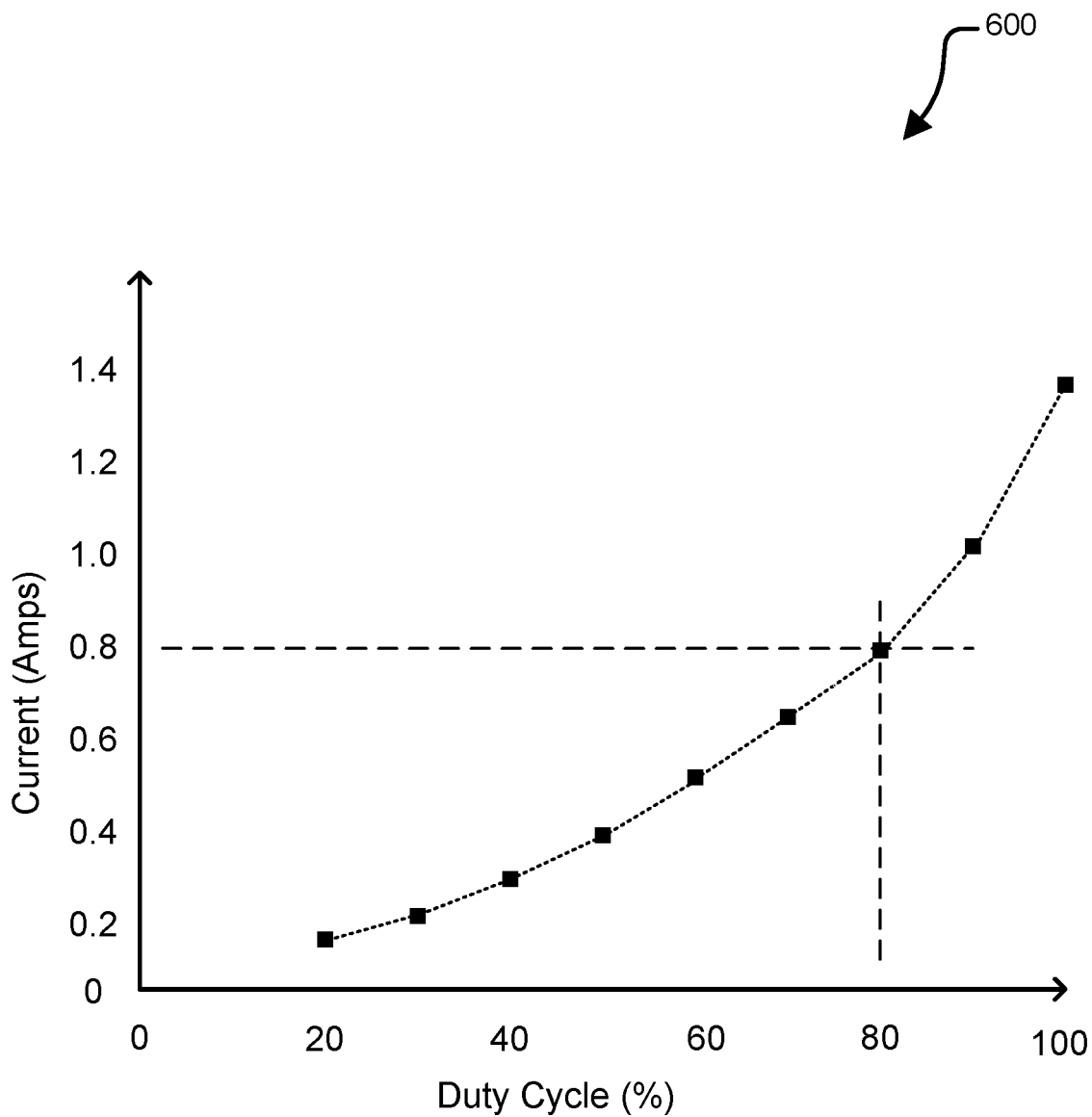
FIG. 6 is a graph illustrating a relationship between current consumption at a cooling fan as a function of a duty cycle of an energizing signal, according to a specific embodiment of the present disclosure.

FIG. 6 shows a graph 600 illustrating a relationship between current consumption at fan 192 as a function of a duty cycle of an energizing PWM signal, according to a specific embodiment of the present disclosure. Graph 600 includes a horizontal axis representing a duty cycle of an energizing PWM signal applied to fan 192, and a vertical axis represent a current consumption of fan 192 corresponding to the PWM duty cycle. The data presented by graph 600 can be provided by the manufacturer of fan 192 or determined by the manufacturer of system 100, and in either case, represents the operating characteristics of fan 192 when new, prior to exhibiting wear. In an embodiment, the data can be expressed as a lookup table, a polynomial expression, or by other means. For clarity, this relationship is referred to herein as a current curve. In an embodiment, the current curve can be stored at a memory device included at BMC 190. Alternatively, the current curve can be stored at fan 192 and communicated to BMC 190 by signal DATA via interconnect 195.

Returning again to FIG. 2, during operation, MCU 193 can utilize interconnect 195 and signal DATA to inform BMC 190 as to the current duty cycle of signal ACTUAL PWM. In response, BMC 190 can estimate a present current consumption of fan 192 based on the duty cycle of signal ACTUAL PWM and further based on the current curve of FIG. 6. For example, if the duty cycle of signal ACTUAL PWM is 80%, graph 600 shows that the current consumption of fan 192 is approximately 0.8 Amperes. Furthermore, BMC 190 can estimate a degree of wear at cooling fan 192 based on a difference between the duty cycle of signal ACTUAL PWM and the duty cycle of signal INPUT PWM. Based on the estimated current consumption of fan 192, BMC 190 can initiate remedial actions. For example, if the current consumption exceeds a predetermined threshold, BMC 190 can alert administration personnel that maintenance or replacement of fan 192 is needed. In addition, BMC can update an event log to identify the situation. In an embodiment, BMC 190 may reconfigure power allocation at system 100, such as decreasing a computational workload so as to maintain safe cooling levels and/or to prevent exceeding the capabilities of a power supply unit supplying power to system 100.

Figure 3:
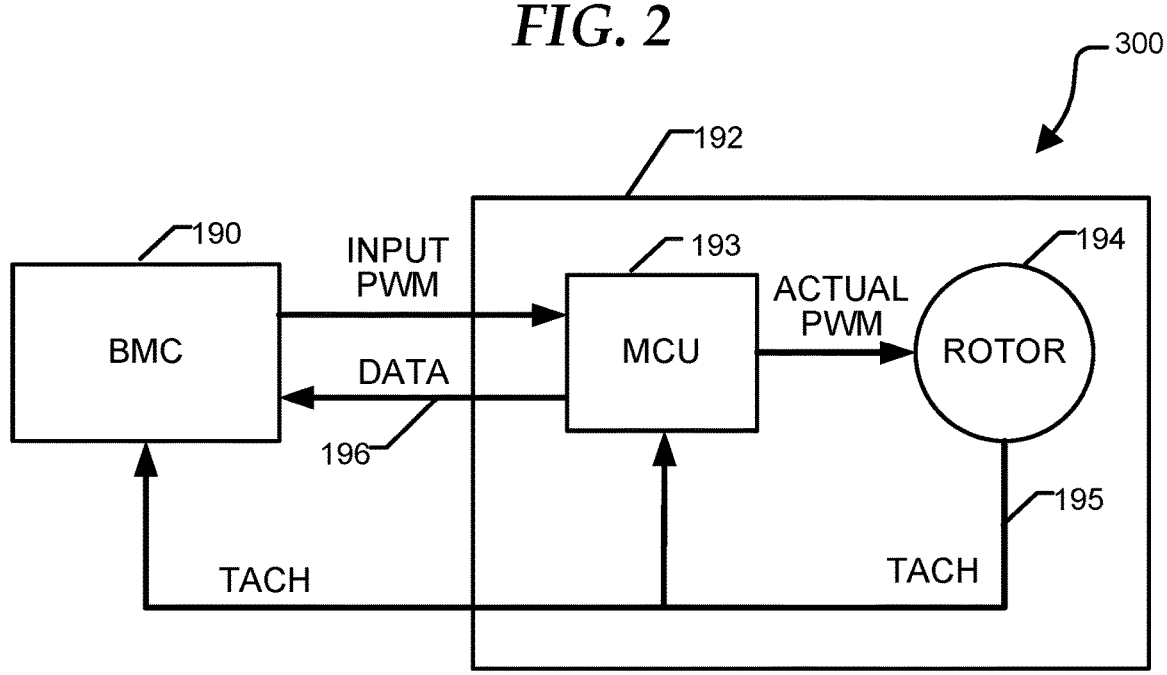
FIG. 3 is a block diagram illustrating a system for estimating current consumption at a cooling fan according to another embodiment of the present disclosure.

FIG. 3 shows a system 300 for estimating current consumption at a cooling fan according to another embodiment of the present disclosure. System 300 includes BMC 190 and cooling fan 192. Cooling fan 192 includes an MCU 193 and a rotor 194. BMC 190 includes an output to provide signal INPUT PWM to MCU 193, an input coupled to an interconnect 195 to receive signal TACH from rotor 194, and an input coupled to a serial interface 196 to receive duty cycle information, DATA, from MCU 193. MCU 193 has an input to receive signal INPUT PWM, an input to receive signal TACH via interconnect 195, an output to provide signal ACTUAL PWM to rotor 194, and an output to provide signal DATA to BMC 190 via serial interface 196. Rotor 194 has an input to receive signal ACTUAL PWM from MCU 193 and an output to provide signal TACH to interconnect 195.

Operation of system 300 is similar to that of system 200 described above, with the exception that the information identifying the duty cycle of signal ACTUAL PWM is provided to BMC 190 via serial interface 196 instead of via interconnect 195.

Figure 7:
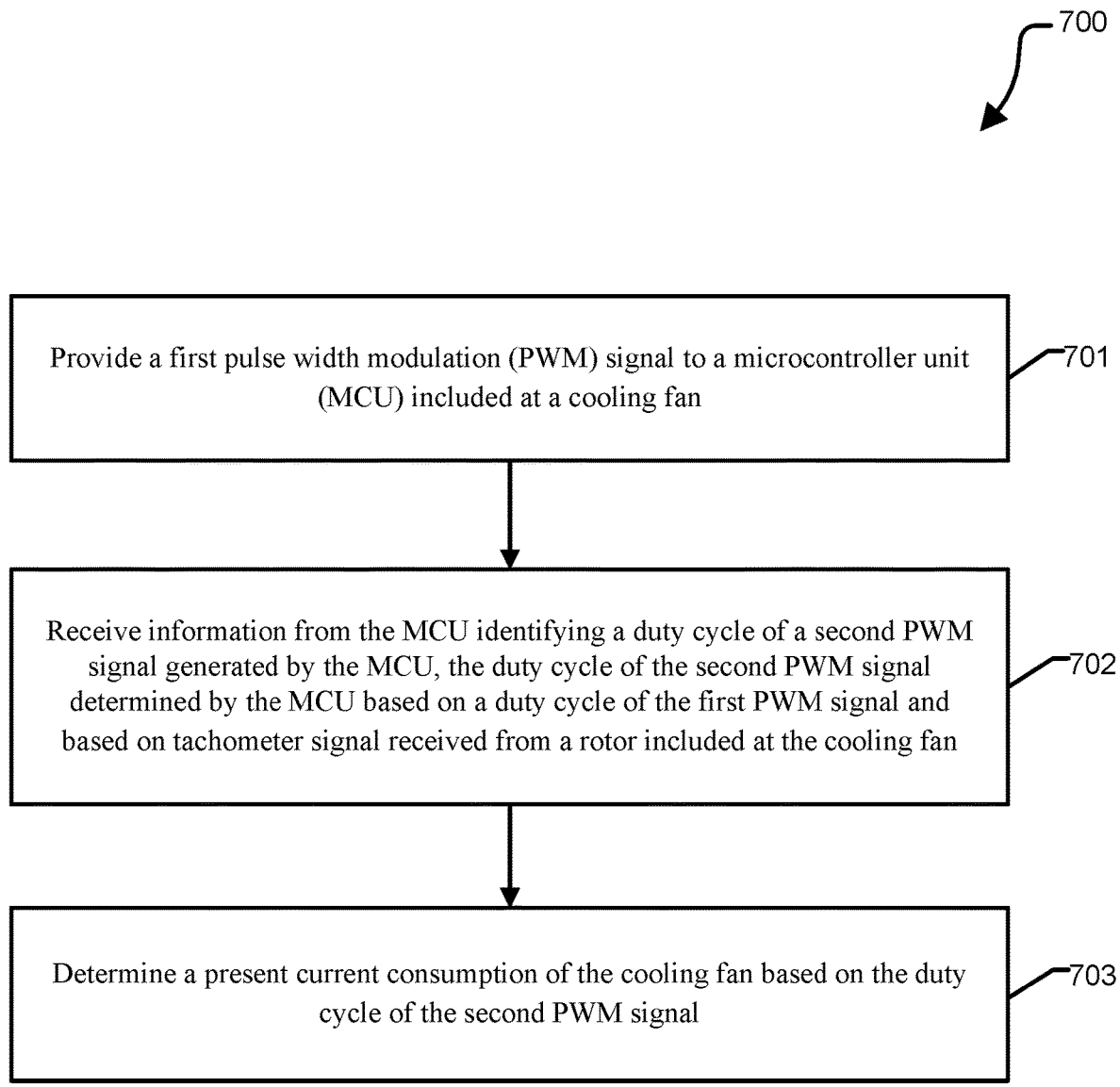
FIG. 7 is a flow diagram illustrating a method for estimating current consumption at a cooling fan according to a specific embodiment of the present disclosure.

FIG. 7 shows a method for estimating current consumption at a cooling fan according to a specific embodiment of the present disclosure. Method 700 begins at block 701 where a first PWM signal is provided to an MCU included at a cooling fan. For example, BMC 190 can initiate operation of cooling fan 192 by supplying signal INPUT PWM to MCU 193. The duty cycle of signal INPUT PWM selected to provide a desired operating speed of fan 192. Method 700 continues at block 702 where information from the MCU identifying a duty cycle of a second PWM signal generated by the MCU is received, the duty cycle of the second PWM signal determined by the MCU based on a duty cycle of the first PWM signal and based on tachometer signal received from a rotor included at the cooling fan. For example, MCU 193 can determine, based on tachometer signal TACH, that rotor 194 is not operating at a speed that would be expected based on the duty cycle of signal INPUT PWM. Accordingly, MCU can increase the duty cycle of signal ACTUAL PWM until the desired rotor speed is achieved. Method 700 completes at block 703 where a present current consumption of the cooling fan is determined based on the duty cycle of the second PWM signal. For example, BMC 190 can utilize a lookup table or polynomial expression representing the current consumption graph of FIG. 6 to estimate a present current consumption of fan 192 based on the duty cycle of signal ACTUAL PWM.

Referring back to FIG. 1, the information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media. A network interface device (not shown at FIG. 1) can provide connectivity to a network, such as a wide area network (WAN), a local area network (LAN), or other network.

In an alternative embodiment, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a cooling fan; and
   a baseboard management controller (BMC), the BMC to:
     provide a first pulse width modulation (PWM) signal to a microcontroller unit (MCU) included at the cooling fan;
     receive first information from the MCU identifying a duty cycle of a second PWM signal generated by the MCU and provided to a rotor included at the cooling fan, the duty cycle of the second PWM signal determined by the MCU based on a first duty cycle of the first PWM signal and based on a tachometer signal received from the rotor;

determine a present current consumption of the cooling fan based on the first information; and determine a degree of wear of the cooling fan based on a difference between the first duty cycle of the first PWM signal and the duty cycle of the second PWM signal.

2. The information handling system of claim 1, wherein the BMC is configured to:

receive second information identifying current consumption of the cooling fan as a function of a duty cycle of a PWM signal applied to the rotor, the second information determined prior to wear of the rotor; and determine the present current consumption of the rotor further based on the second information.

3. The information handling system of claim 2, wherein the second information is received from the MCU.

4. The information handling system of claim 2, wherein the second information is received from a memory device at the BMC.

5. The information handling system of claim 1, wherein the BMC is further configured to determine a degree of wear of the rotor based on the first duty cycle of the first PWM signal and the first information.

6. The information handling system of claim 5, wherein the BMC is further configured to alert system administration personnel when the degree of wear exceeds a first predetermined threshold value.

7. The information handling system of claim 5, wherein the BMC is further configured reduce computational performance of the information handling system in response to determining that the degree of wear exceeds a second predetermined threshold.

8. The information handling system of claim 1, wherein the BMC is further configured to adjust power allocation at the information handling system based on the present current consumption.

9. The information handling system of claim 1, wherein the MCU is configured to provide the first information to the BMC over an interconnect that couples a tachometer signal to the BMC.

10. The information handling system of claim 1, wherein the MCU is configured to provide the first information to the BMC using a serial interface protocol.

11. A method comprising:

providing a first pulse width modulation (PWM) signal to a microcontroller unit (MCU) included at a cooling fan;

receiving first information from the MCU identifying a duty cycle of a second PWM signal generated by the MCU, the duty cycle of the second PWM signal determined by the MCU based on a first duty cycle of the first PWM signal and based on a tachometer signal received from a rotor included at the cooling fan;

determining a present current consumption of the cooling fan based on the first information; and determining a degree of wear of the cooling fan based on a difference between the first duty cycle of the first PWM signal and the duty cycle of the second PWM signal.

12. The method of claim 11, wherein determining the present current consumption is further based on second information identifying current consumption of the cooling fan as a function of a duty cycle of a PWM signal applied to the rotor, the second information determined prior to wear of the rotor.

13. The method of claim 11, further comprising determining a degree of wear of the rotor based on the first duty cycle of the first PWM signal and the first information.

14. The method of claim 11, further comprising adjusting power allocation at the information handling system based on the present current consumption.

15. The method of claim 11, further comprising receiving the first information over an interconnect configured to communicate a tachometer signal to a baseboard management controller.

16. A method comprising:

receiving a first pulse width modulation (PWM) signal at a microcontroller unit (MCU) included at a cooling fan;

receiving, at the MCU, a tachometer signal from a rotor included at the cooling fan;

generating, at the MCU, a second PWM signal based on the first PWM signal and the tachometer signal;

providing the second PWM signal to the rotor; and providing first information identifying a duty cycle of the second PWM signal to a baseboard management controller (BMC), wherein a degree of wear of the cooling fan is determined based on a difference between a first duty cycle of the first PWM signal and the duty cycle of the second PWM signal.

17. The method of claim 16, further comprising:

determining, at the BMC, a present current consumption of the cooling fan based on the first information.

18. The method of claim 17, wherein determining the present current consumption is further based on second information identifying current consumption at the cooling fan as a function of a duty cycle of a PWM signal applied to the rotor, the second information determined prior to wear of the rotor.

19. The method of claim 16, further comprising determining a degree of wear of the rotor based on the first duty cycle of the first PWM signal and based on the first information.

20. The method of claim 19, wherein the BMC is further configured to alert system administration personnel when the degree of wear exceeds a first predetermined threshold value.

* * * * *